United States Patent [19]

Hsiao

[11] Patent Number: 5,707,894
[45] Date of Patent: Jan. 13, 1998

[54] BONDING PAD STRUCTURE AND METHOD THEREOF

[75] Inventor: Ming-Shan Hsiao, Hsin-Chu, Taiwan

[73] Assignee: United Microelectronics Corporation, Hsin-Chu, Taiwan

[21] Appl. No.: 549,629

[22] Filed: Oct. 27, 1995

[51] Int. Cl.$^6$ .................................. H01L 21/60
[52] U.S. Cl. ................. 437/209; 437/190; 437/192
[58] Field of Search .................... 437/190, 192, 437/194, 195, 209

[56] References Cited

U.S. PATENT DOCUMENTS

| | | | |
|---|---|---|---|
| 4,600,658 | 7/1986 | Anderson et al. | 428/450 |
| 4,800,177 | 1/1989 | Nakamae | 437/193 |
| 5,057,447 | 10/1991 | Paterson | 437/43 |
| 5,309,025 | 5/1994 | Bryant et al. | 257/784 |
| 5,476,817 | 12/1995 | Numata | 437/190 |
| 5,488,013 | 1/1996 | Geffken et al. | 437/190 |
| 5,534,462 | 7/1996 | Fiordalice et al. | 437/190 |

*Primary Examiner*—Kevin Picardat
*Attorney, Agent, or Firm*—William H. Wright; Alan S. Raynes

[57] ABSTRACT

A structure and a process for forming an improved bonding pad which resists bond pad peeling of between the bonding pad layer and the underlying layers. The method comprises forming plurality of anchor pads on said substrate surface in a bonding pad area. Next, a first insulating layer is formed over said substrate surface and the anchor pads. Vias are formed through the first insulating layer. The vias are filled with a second metal layer making a connection to the anchor pads and the first insulating layer is covered in the bonding pad area with the second metal layer. It is important that the via holes have a smaller cross sectional area than the anchor pads so that the combination of the anchor pads and the second metal form small "hooks" into the first insulating layer that hold the second metal (bonding pad layer) to the underlying layer.

20 Claims, 3 Drawing Sheets

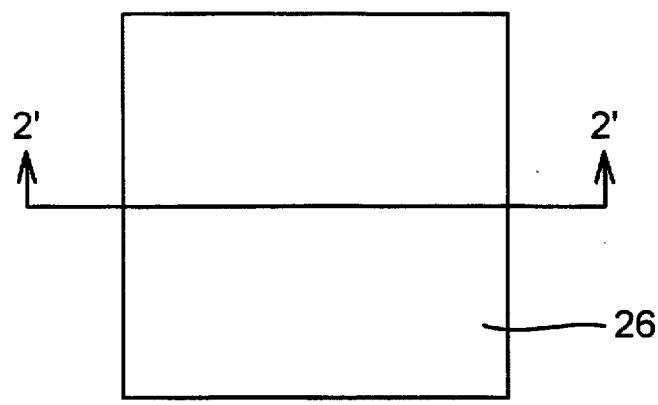
FIG. 1 - Prior Art
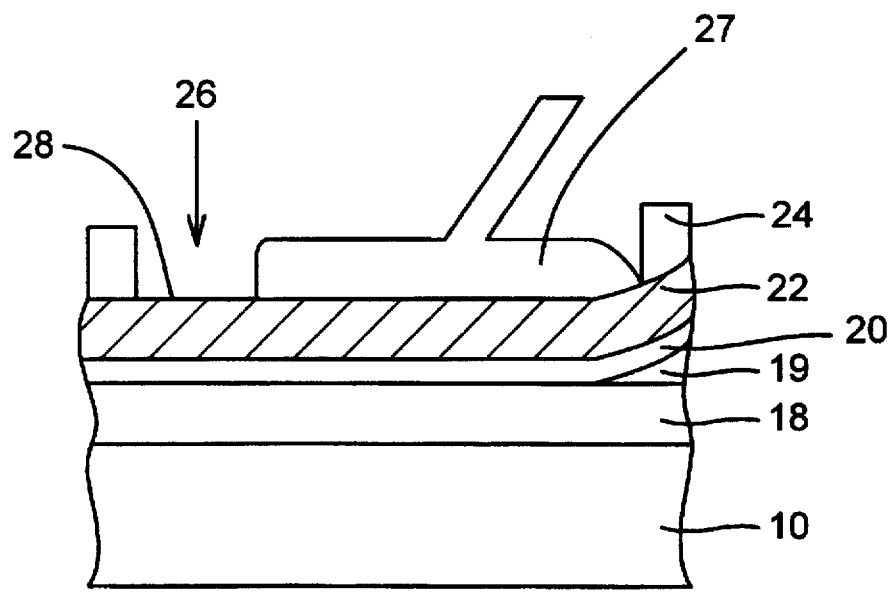
FIG. 2 - Prior Art

BONDING PAD STRUCTURE AND METHOD THEREOF

BACKGROUND OF INVENTION

1) Field of the Invention

The present invention relates in general to semiconductor integrated circuits, and more specifically to the formation of a bonding pad structure and method for fabricating such structures.

2) Description of the Prior Art

After an integrated circuit device has completed the fabrication process, it is usually assembled into a package to be utilized on a printed circuit board as part of a larger circuit. In order for the inner leads of the package to make electrical contact with the bonding pads of the fabricated devices, a metal contact is formed at the bonding pad of the device with a lead extending to the inner lead of the package lead frame.

During the formation of a contact to a bonding pad, bond pad lift off may occur. This problem may result when a large heavy contact metal (e.g., an aluminum interconnect) is placed on top of layers which have not formed a strong adhesion to the underlying layers. During formation of aluminum interconnect, it is common to form an underlying barrier layer of a material. This barrier layer is utilized to prevent aluminum from spiking into any underlying conductive layers during later fabrication steps. However, the barrier layer, which usually does not form a strong adhesion to the oxide underlying the bond pad and may separate during the bonding process, especially in the chip on board bonding process.

FIGS. 1 and 2 shown a bonding pad 50 of the prior art. A dielectric layer 18 is formed on a substrate 10 surface. A barrier layer 20 is formed over the dielectric layer 18. Next, a metal bonding layer 22 is formed over the barrier layer 20. A passivation layer 24 is formed and a window 26 is opened which defines a bond pad area 28. A metal contact or bonding pad contact 27 can be made to the metal bonding layer 22.

The barrier layer 20 is used to prevent the bonding metal layer 22 from spiking into the underlying dielectric layer 18. Unfortunately, the barrier layer 20 sometimes does not have a good adhesion to the underlying dielectric layer 18. As shown in FIG. 2, this poor adhesion can lead to separation 19 of the barrier layer 20 from the dielectric layer 18, often call "bond pad peels off". This "peel off" 19 reduces the bonding yields and is a major problem in semiconductor manufacture, especially as devices are made smaller.

Therefore it would be desirable to provide a method for forming an improved bond pad structure whereby a bond may be formed at a bonding pad which is resistant to layer separation at the bonding pad.

Anderson et at., U.S. Pat. No. 4,600,658, teaches a method of forming an adhesion layer between a resistive barrier layer and the substrate. The adhesion layer improves the bond strength between the barrier layer and the substrate.

Bryant et al., U.S. Pat. No. 5,309,025, teaches a method of forming an improved bonding pad structure. A bond pad structure is formed by patterning a barrier layer and first conductive (metal) layer thereby exposing the underlying regions of a semiconductor device. A second conductive layer is formed over the first conductive layer and the exposed underlying regions. The second conductive layer makes a good adhesive contact with the underlying regions, thus preventing bond pad pull off.

Nakane, U.S. Pat. No. 4,800,117 and Paterson U.S. Pat. No. 5,057,447 also discuss Bonding pad formation.

SUMMARY OF THE INVENTION

It is an object of this invention to provide a structure and process for a bonding pad layout which improves bonding yield.

It is another object of the invention to provide a structure and process for fabricating a bonding pad which increases the adhesion of the bonding metal layer and reduces bond pad "peel".

Accordingly, the present invention provides a structure and process to form an improved bonding pad in a bonding pad area that resists bonding pad peeling. The method begins by providing a semiconductor substrate having active and passive devices formed therein and thereon. A first metal layer is formed on the substrate surface and patterned to form a plurality of anchor pads on the substrate surface in a bonding pad area. A first insulating layer is formed over the substrate surface layer and the anchor pads. Vias are formed through the first insulating layer. The vias are filled with a second metal layer making a connection to the anchor pad and the first insulating layer is then covered in the bonding pad area with the second metal layer. It is important that the via holes have a smaller cross sectional area than the anchor pads so that the combination of the anchor pads and the second metal form small "hooks" into the first insulating layer that hold the second metal in place. The bonding pad of the present invention resists peeling of the second metal because of the anchoring effect of the anchor pads and the metal via connection.

Briefly, the structure of the an improved bonding pad which resists bonding pad peeling comprises: a semiconductor substrate having active and passive devices formed therein and thereon; the substrate having a substrate surface; a plurality of anchor pads on the substrate surface in a bonding pad area; a first insulating layer over the substrate surface and the anchor pads; via holes through the first insulating layer; the via holes having a smaller cross-sectional area than the anchor pads; a second metal layer filling the via holes making a connection to the plurality of anchor pads; and the second metal layer covering the first insulating layer in the bonding pad area.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1 shows a top down view of a bonding pad area of a prior art structure.

FIG. 2 shows cross sectional view of the bonding pad area of the prior an taken along line 2' in FIG. 1.

DETAILED DESCRIPTION OF THE PREFERRED EMBODIMENTS

Figure 4A:
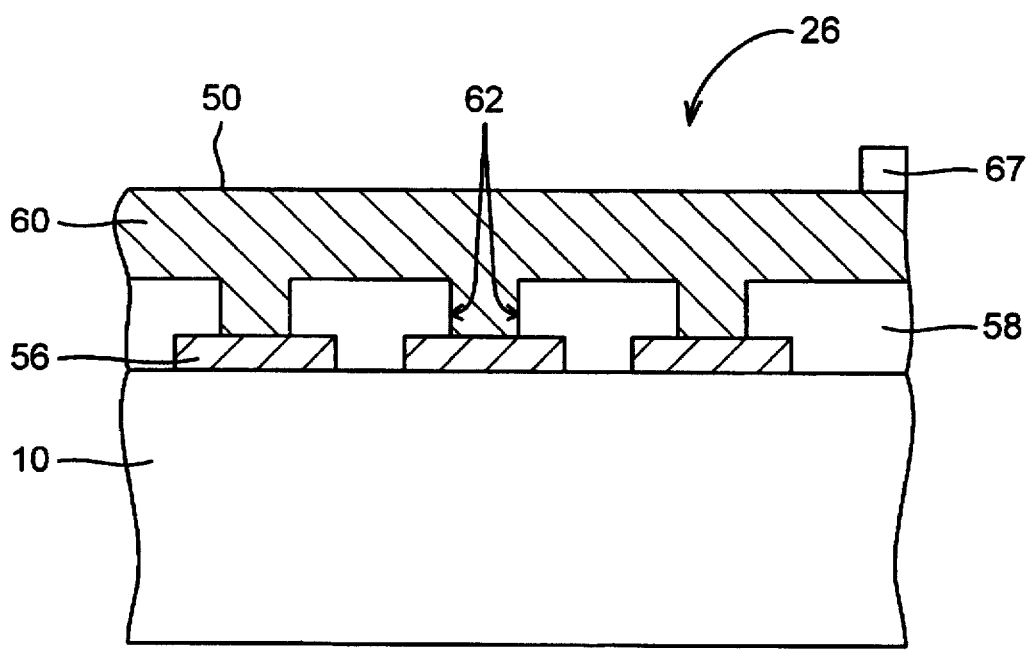
FIG. 4A shows a cross sectional view an embodiment of the bonding pad area of the present invention as taken along line 4' in FIG. 3.

Accordingly, the current invention provides a method of forming an improved bonding pad in a bonding pad area on a substrate 10 as shown in FIG. 4a. Substrate 10 is understood to possibly include a semiconductor wafer, active and passive devices formed within the wafer and layers formed on the wafer surface. The substrate 10 can include a top surface layer 88 (See FIG. 5) of insulating material formed from a material, such as phosphosilicate glass (PSG), borophosphosilicate glass (BPSG), and silicon oxide. The term "substrate" is mean to include devices formed within a semiconductor wafer and the layers overlying the wafer. The term "substrate surface" is meant to include the upper most exposed layers on a semiconductor wafer, such as a silicon surface, an insulating layer and metallurgy lines.

Figure 3:
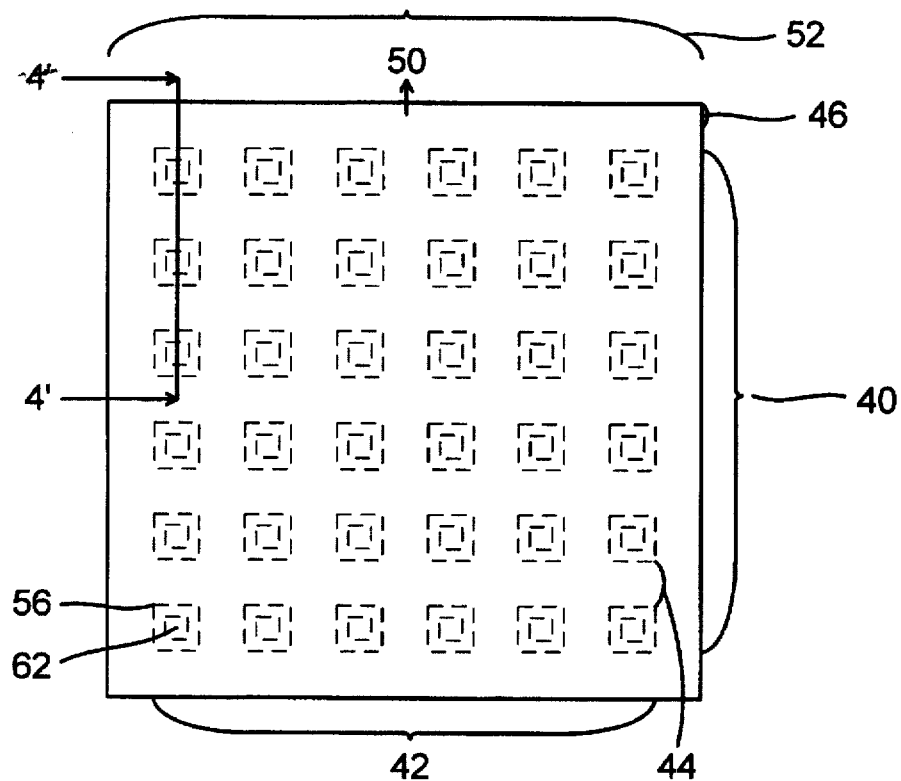
FIG. 3 shows a top down view of a bonding pad area of the present invention.
Figure 4B:
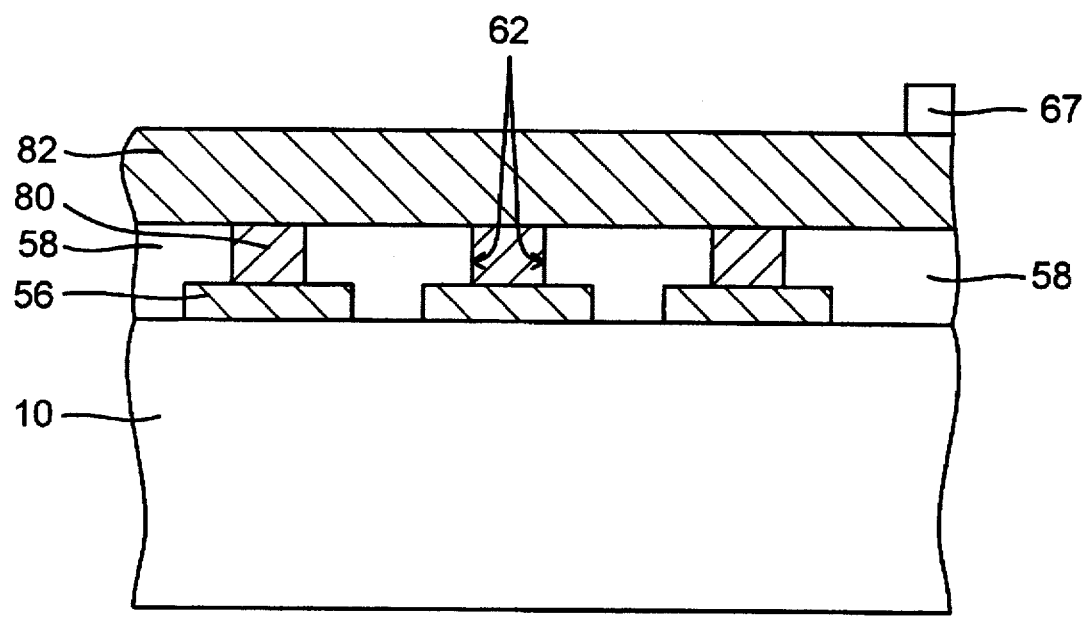
FIG. 4B shows a cross sectional view of an embodiment of the bonding pad area of the present invention as taken along line 4' in FIG. 3.

A first metallurgy layer (not shown) (i. e., an anchor pad metallurgy layer ) can be formed on the substrate surface. The first metallurgy layer can be composed of Aluminum, polysilicon, polycide, or a diffusion in the substrate. The anchor pad metal layer is formed into a plurality of anchor pads 56 in an bonding pad area 50 using conventional photolithography and etching techniques. As shown in FIGS. 3, 4a, and 4b, a plurality of anchor pads 56 is formed the substrate surface in a bonding pad area 50.

The bonding pad area 50 is the area where the bonding pad is formed and in which a connection is made to the bonding pad. The bonding pad area can have any shape. The bonding pad area 50 preferably has a square shape with a length and a width 52 in the range between about 70 to 150 μm and more preferably about 100 μm.

The anchor pads 56 can have a thickness in the range between about 1000 to 12,000 Å and more preferably about 6000 Å. The anchor pads 56 can have any shape. The anchor pads 56 preferably have a square shape with a length and width in the range between about 0.5 to 5 μm and more preferably about 2.0 μm. The spacing 44 between adjacent metal pads 56 (see FIG. 3) can be in the range between about 0.5 to 10 μm and more preferably about 2 μm. As shown in FIG. 3, the distance 46 between the anchor pads 56 on the end era row and the edge of the bond pad area 50 can be in the range between about 0 to 10 μm and more preferably about 2 μm.

A first insulating layer 58 is then formed over the substrate surface and the anchor pads 56. The first insulating layer 58 can have a thickness in the range between about 3000 to 20,000 Å and more preferably about 15,000 Å. The first insulating layer can be formed of silicon oxide, borophosphosilicate glass (BPSG), and phosphosilicate glass (PSG). The first insulating layer is preferably formed of borophosphosilicate glass material. A borophosphosilicate glass layer can be formed by low pressure chemical vapor deposition (LPCVD) using tetraethylorthosilicate (TEOS) as a reactant.

As seen in FIG. 4a, vias holes 62 are formed through the first insulating layer 58. The via holes have a smaller cross-sectional area than the anchor pads 56. In certain embodiments, the vias may have a square shape with a length and width in the range of between about 0.3 to 5 μm. The vias holes 62 may then be filled with a second metal layer 60, which makes contact with the anchor pads 56 and also covers the first insulating layer 58, as illustrated in FIG. 4a. The second metal layer 60 may have a thickness in the range between about 5000 Å to 15,000 Å. Layer 67 may be formed over a portion of the second metal layer 60, and act as a border for the bonding pad area 250, as illustrated in FIG. 4a.

Figure 5:
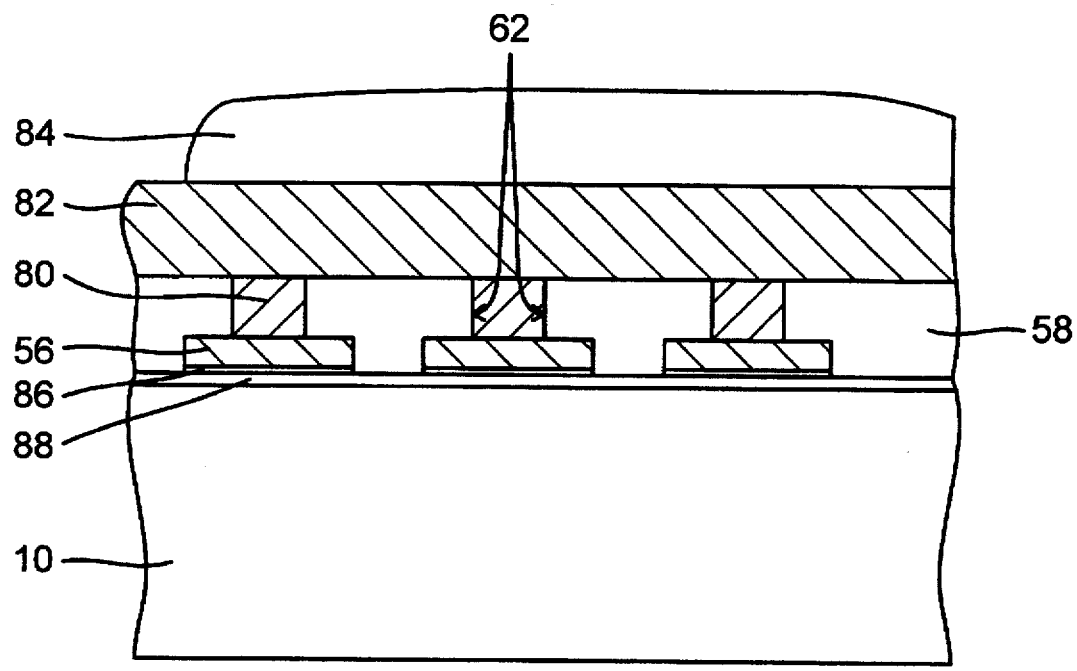
FIG. 5 shows a cross sectional view of an embodiment of the bonding pad area of the present invention as taken along line 4' in FIG. 3 where the second metal layer is formed of two layers.

In other imbodiments of the present invention, the second metal layer 60 illustrated in FIG. 4 may be made up of two metal layers 80 and 82, as illustrated in FIG. 5. Via metal layer 80 is located in the via holes 62 and a third metal layer 82 overlies the via metal and the first insulating layer 58. The third metal layer 82 is preferably composed formed of Al—Si—Cu. The third metal layer 82 can have a thickness in the range between about 5000 to 20,000 Å and more preferably about 10,000 Å.

A metal contact 84 or bond pad contact can be made to the third metal layer 84 as shown in FIG. 5. The metal contact 84 can be composed of Al and gold metals.

As shown in FIG. 5, another embodiment of the current invention is where a barrier layer 86 is formed over the dielectric layer 88. The anchor pads 56 are then formed over the barrier layer 86. The patterning step for the anchor pads 56 can be used to pattern the barrier layer so that the barrier layer underlies only the anchor pads 56 as shown in FIG. 5. The dielectric layer 88 can be formed of silicon oxide, borophosphosilicate glass (BPSG), and phosphosilicate glass (PSG). The barrier layer 86 can be formed of TiN or Ti. The TiN barrier layer 86 can have a thickness in the range between about 100 to 2000 Å and more preferably about 500 Å.

The bonding pad of the current invention resists peeling of the second metal and the anchor pads because of the anchoring effect of the anchor pads and the metal via connection. The plurality of anchor pads "hooks" the bonding pad (e.g., second metal layer 60) to the first insulating layer 58 thus preventing peeling. The invention provides for an inexpensive process to greatly improve bonding pad strength and increase yields.

While the invention has been particularly shown and described with reference to the preferred embodiments thereof, it will be understood by those skilled in the art that various changes in form and details may be made without departing from the spirit and scope of the invention.

What is claimed is:

1. A method of forming an integrated circuit having an improved bonding pad which resists bonding pad peeling, the method comprising:

providing a substrate having active or passive devices formed therein or thereon and having a substrate surface;

forming a first metal layer over said substrate surface;

masking and etching said first metal layer to form an array of anchor pads on said substrate surface in a bonding pad area;

forming a first insulating layer over said substrate and said array of anchor pads, said anchor pads laterally separated from one another by said first insulating layer;

forming via holes through said first insulating layer to expose surfaces of said anchor pads, said via holes having a smaller cross sectional area than said anchor pads;

filling said via holes with a second metal layer and covering said first insulating layer in said bonding pad area with said second metal layer, said second metal layer making connections to said anchor pads through said via holes.

2. The method of claim 1 which further includes a metal contact to said second metal layer; and said metal contact is composed of a material selected from the group consisting of: aluminum and gold.

3. The method of claim 1 wherein said anchor pads have a square shape with a length and a width in the range between about 0.5 to 5.0 µm.

4. The method of claim 1 wherein said via holes have a square shape with a length and width in the range between about 0.3 to 5.0 µm.

5. The method of claim 1 where said anchor pads have a thickness in the range between about 1000 to 12,000 Å.

6. The method claim 1 wherein said first insulating layer has a thickness in the range between about 3000 to 20,000 Å.

7. The method claim 1 wherein said first insulating layer is formed of a material selected from the group consisting of silicon oxide, borophosphosilicate glass (BPSG), and phosphosilicate glass (PSG).

8. The method of claim 1 wherein said second metal layer is formed by forming a via metal layer filling said via holes, and forming a third metal layer overlying the via metal layer.

9. The method of claim 8 wherein said third metal layer has a thickness in the range between about 5000 to 20,000 Å.

10. The method of claim 8 wherein said second metal layer has a thickness in the range between about 5000 Å to 15,000 Å.

11. The method of claim 1 which further includes forming a dielectric layer on the substrate surface, forming a titanium nitride layer on said dielectric layer and forming said second metal layer over said titanium nitride layer.

12. The method of claim 1 wherein said anchor pads are formed of a material selected from the group consisting of: aluminum, polycide, polysilicon, and a diffusion in said substrate.

13. The method of claim 1 wherein the spacing between adjacent metal pads is in the range between about 0.5 to 10 µm.

14. The method of claim 1, wherein said via holes are centered on said anchor pads.

15. A method for forming integrated circuit device including a bonding pad with an anchor structure, the method comprising:

forming a conducting layer over a substrate;

removing a portion of said conducting layer to form first and second individual anchor pads in the conducting layer;

forming a first dielectric layer over and between said first and second individual anchor pads;

forming a first via through said first dielectric layer and contacting said first individual anchor pad, said first via having a smaller cross-sectional area than said first individual anchor pad;

forming a second via through said first dielectric layer and contacting said second individual anchor pad; said second via having a smaller cross-sectional area than said second individual anchor pad; and placing conducting material above said first dielectric layer and within said first and second vias to contact said first and second individual anchor pads, wherein a lower portion of said conducting material contacts said first and second individual anchor pads and an upper portion of said conducting material connects both said first and second anchor pads to an external contact.

16. The method of claim 15, wherein said conducting material includes two metal layers.

17. The method of claim 15, wherein said vias and anchor pads are formed to be square in shape when viewed from above.

18. The method of claim 15, wherein said anchor pads are square in shape when viewed from perpendicular to said substrate.

19. The method of claim 15, wherein said vias and anchor pads are square in cross section.

20. The method of claim 15, wherein said first via contacts said first anchor pad in a center of said first anchor pad.

* * * * *